United States Patent [19]
Keeth

[11] Patent Number: 6,111,446
[45] Date of Patent: Aug. 29, 2000

[54] INTEGRATED CIRCUIT DATA LATCH DRIVER CIRCUIT

[75] Inventor: Brent Keeth, Boise, Id.

[73] Assignee: Micron Technology, Inc., Boise, Id.

[21] Appl. No.: 09/045,609

[22] Filed: Mar. 20, 1998

[51] Int. Cl.$^7$ ...................................................... H03K 5/13
[52] U.S. Cl. ......................... 327/258; 327/259; 327/295; 327/296
[58] Field of Search .................... 327/254–259, 327/238, 239, 291, 295, 296, 298, 299; 365/233

[56] References Cited

U.S. PATENT DOCUMENTS

| | | | |
|---|---|---|---|
| 5,825,711 | 10/1998 | Manning | 365/230.03 |
| 5,831,929 | 11/1998 | Manning | 365/233 |
| 5,838,177 | 11/1998 | Keeth | 327/108 |
| 5,852,378 | 12/1998 | Keeth | 327/171 |
| 5,867,453 | 2/1999 | Wang et al. | 327/239 |
| 5,870,347 | 2/1999 | Keeth et al. | 365/230.03 |
| 5,872,736 | 2/1999 | Keeth | 365/189.05 |
| 5,874,845 | 2/1999 | Hynes | 327/259 |
| 5,877,636 | 3/1999 | Truong et al. | 327/99 |
| 5,898,638 | 4/1999 | Keeth | 365/230.06 |

OTHER PUBLICATIONS

Descriptive literature entitled, "400MHz SLDRAM, 4M×16 SLDRAM Pipelined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomputer Standards Subcommittee of the IEEE Computer Society, Copyright 1996 by the Institute of Electrical and Electronics Engineers, Inc. New York, NY, pp. 1–56.

*Primary Examiner*—Tuan T. Lam
*Attorney, Agent, or Firm*—Dorsey & Whitney LLP

[57] ABSTRACT

A synchronous memory device and system are described which communicates bi-directional data via a bus and data clock. To capture data from the bus, a memory device latch circuit is described which operates in response to internally generated clock signals. A pulse generator circuit is described which produces these internal clock signals, and insures accurate latching of data by minimizing signal skew between the internal clock signals to avoid wasting valuable timing. The pulse generator circuit has at least two propagation paths that are symmetrical and operate in response to clock signals which are 90 degrees out-of-phase. A second pulse generator circuit is described minimizes skew by having symmetrical clock paths and also corrects duty cycle error present on the data clock. This second circuit uses three clock signals which have relative phases of 0, 90 and 180 degrees.

16 Claims, 10 Drawing Sheets

INTEGRATED CIRCUIT DATA LATCH DRIVER CIRCUIT

TECHNICAL FIELD OF THE INVENTION

The present invention relates generally to integrated circuits and in particular the present invention relates to an integrated circuit data latch driver circuit.

BACKGROUND OF THE INVENTION

Many high-speed integrated circuit devices, such as synchronous dynamic random access memories (SDRAM) rely upon clock signals to control the flow of commands, data, addresses, and other signals throughout the devices. Additionally, circuit architectures such as RAMBUS and SLDRAM require individual devices to work in unison even though such parts may individually operate at different speeds. As a result, the ability to control the operation of the device through the generation of local clock signals has become increasingly more important.

Typically, synchronous device operations are initiated at the edges of a clock signal (i.e. transitions from high to low, or low to high logic states). To more precisely control the timing of operations within the device, each period of a clock signal is sometimes divided into several periods so that certain operations do not begin until shortly after a clock edge. One method for controlling the timing of operations within a period of a clock signal uses phase-delayed versions of the clock signal. For example, to divide a clock signal into four sub-periods, phase delayed versions are produced which lag the clock signal by 45, 90 and 180 degrees, respectively. Edges of the phase-delayed clock signals provide signal transitions at the beginning or end of each sub-period which can be used to initiate device operations. An example approach is illustrated in the FIG. 1 where the timing of operations in a memory device 10 is defined by an externally provided control clock reference signal CCLKREF and an externally provided data clock reference signal DCLKREF. The reference clock signals are generated in a memory controller 11 and transmitted to the memory device over a control clock bus 13 and a data clock bus 14, respectively. The reference clock signals have identical frequencies, although the control clock reference signal is a continuous signal in the data clock reference signal is a discontinuous signal which does not include a pulse for every CCLKREF period. The delay circuit 20 is provided to delay the control clock reference signal and produce a delayed control clock signal for controlling internal latch circuits 18 and output latches 19. Likewise, a delay circuit is used to generate a delayed data clock reference signal for controlling input data latches 24.

Because it is desired to allow some adjustment of the delayed signals, a delay lock loop circuit can be provided in delay circuits 20 and 26. A conventional multiple output variable delay line circuit can be used to generate multiple delayed signals with increased lag relative to the control clock reference signal. See Maneatis, "Low-Jitter Process-Independent DLL and PLL Based on Self-Biased Techniques," IEEE Journal of Solid-State Circuits 31(11):1723–1732, November 1996 for a description of a multiple output variable delay line. The data latch/driver circuits provided in a memory device often operate using multiple clock signals. Because accurate operation of the data latch/driver circuits in a synchronous memory device is critical, latch control signals must be carefully generated. Accurate placement of critical edge transitions of the latch control signals is desired. As such, skew between data latch signals must be reduced. In addition, automatic correction of duty cycle error which may exist in a reference clock signal is desired. By correcting duty cycle error, latch timing will not exhibit duty cycle error received on the reference clock signal.

For the reasons stated above, and for other reasons stated below which will become apparent to those skilled in the art upon reading and understanding the present specification, there is a need in the art for a circuit which provides data latch driver control signals with very little skew. Further, there is a need in the art for a circuit which provides data latch driver control signals with very little skew and corrects for duty cycle distortion in a timing clock signal.

SUMMARY OF THE INVENTION

The above mentioned problems with integrated circuits and other problems are addressed by the present invention and which will be understood by reading and studying the following specification. A device is described which provides data latch driver signals with little skew between the signals, and can optionally correct for duty cycle error.

In particular, the present invention describes a synchronous memory device comprising a clock signal generator circuit coupled to receive an input clock signal and provide a plurality of phase shifted output signals, and a pulse generator circuit coupled to the clock signal generator circuit for providing first and second output signals having corresponding transitions with minimal skew. The pulse generator circuit comprises a first multiplex circuit coupled to receive a first clock signal and provide a first output signal on a first output node which is coupled to a drain of a first pulldown transistor. The first multiplex circuit is controlled by a second clock signal which is 90 degrees out-of-phase with the first clock signal. A second multiplex circuit is provided and coupled to receive the second clock signal and provide a second output signal on a second output node which is coupled to a drain of a second pulldown transistor. The second multiplex circuit is controlled by the first clock signal.

In another embodiment, a synchronous memory device comprises a clock signal generator circuit coupled to receive a first clock signal and provide a plurality of phase shifted output signals, and a pulse generator circuit coupled to the clock signal generator circuit for providing first and second output signals having corresponding transitions spaced apart by one-half of a period of the first clock signal. The pulse generator circuit comprises a first multiplex circuit coupled to receive the first clock signal and provide a first output signal on a first output node which is coupled to a drain of a first pulldown transistor. The first multiplex circuit is controlled by a second clock signal which is 90 degrees out-of-phase with the first clock signal. A second multiplex circuit is described and coupled to receive a third clock signal which is 180 degrees out-of-phase with the first clock signal and provide a second output signal on a second output node which is coupled to a drain of a second pulldown transistor. The second multiplex circuit is controlled by the second clock signal.

In another embodiment a memory system comprises a memory controller and a synchronous memory device coupled to the memory controller through a data bus for bi-directional data communication in synchronization with a data clock. The synchronous memory device comprises a clock signal generator circuit coupled to receive the data clock signal and provide a plurality of phase shifted output signals, a first pulse generator circuit coupled to the clock signal generator circuit and a second pulse generator circuit coupled to the clock signal generator circuit. The first pulse generator circuit provides first and second output signals having corresponding transitions with minimal skew. The second pulse generator circuit provides first and second output signals having corresponding transitions spaced apart by one-half of a period of the first clock signal.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 13:
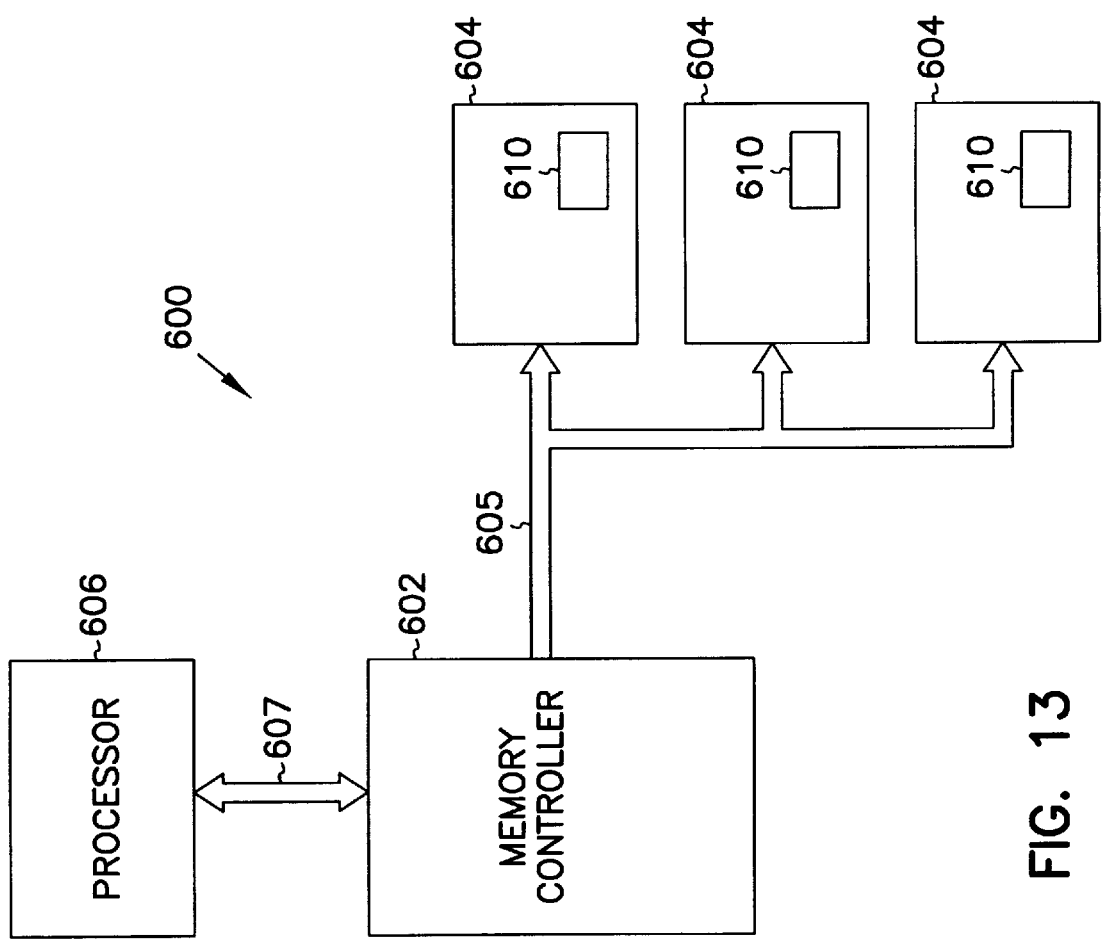
FIG. 13 is a block diagram of a system incorporating the present invention.

Referring first to FIG. 13, a block diagram of a computer system 600 incorporating the present invention is provided. The computer system uses a memory controller 602 in communication with synchronous memory devices 604 through a bus 605. The memory controller is also in communication with a processor 606 through a bus 607. The processor can perform a plurality of functions based on information and data stored in the memory devices. The memory controller communicates with the synchronous memory devices through communication and control lines. In an SLDRAM system (Sync Link DRAM), data communicated between the memory devices and the controller are synchronized with a data clock signal provided on the bus. As described below, when data is received by a memory device, accurate capture of the data from the bus is important. Timing operation of the memory devices is very tight and error experienced as a result of internal clock signal skew is undesirable. In addition, data and its corresponding clock signal which are output from the memory device are preferred to be configured with a 50/50 duty cycle. The present invention, as described herein, provides signal generation circuitry 610 for achieving both minimal internal signal clock skew and an accurate output duty cycle, if desired. Prior to describing this circuitry, a delay lock loop circuit which provides phase delayed signals from the input clock signal is described.

Figure 1:
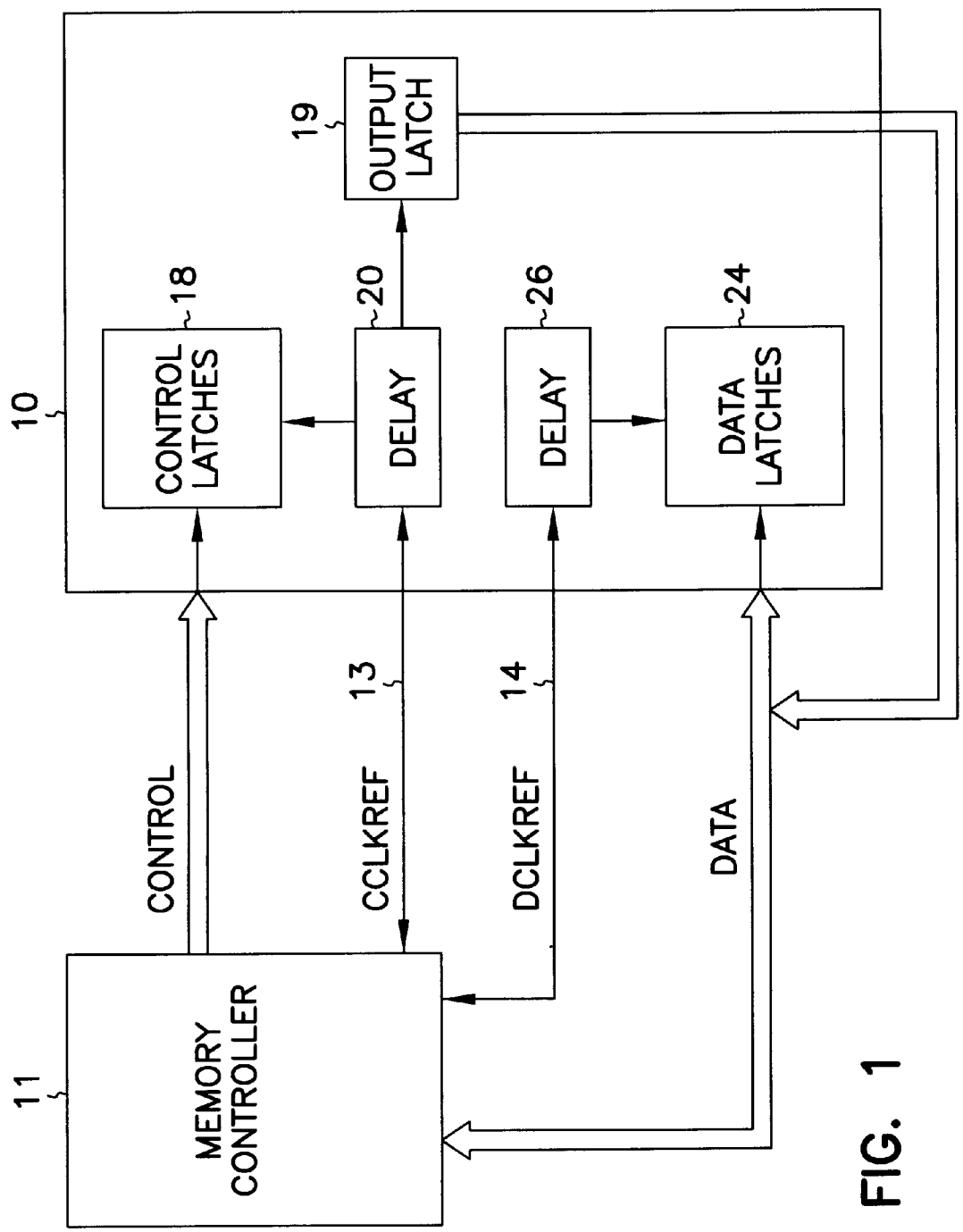
FIG. 1 is a block diagram of a prior art memory system including a memory device and a memory controller linked by control and data buses.
Figure 2:
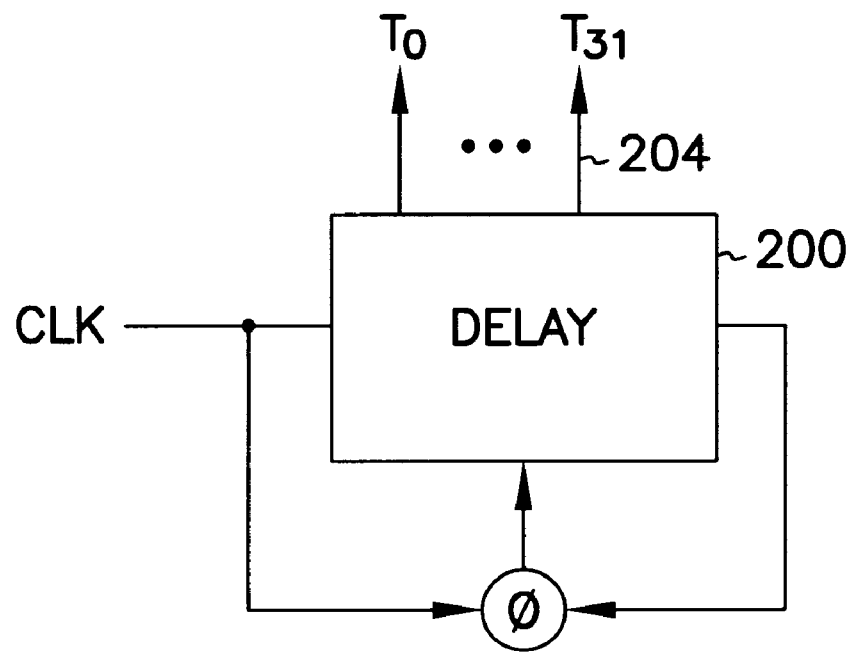
FIG. 2 is a block diagram of a delay lock loop circuit which provides multiple signal output taps.

A delay lock loop circuit 200 is illustrated in FIG. 2. The delay lock loop circuit is a delay line with feedback which is electrically set so that the delay length is one clock period long. The clock input signal is delayed as it passes through the circuit and fed back to phase comparator 202 which adjusts the length of the delay to be equal to one tick (one-half period) of the input clock signal. The delay lock loop circuit includes a plurality of output phase signal taps which provide different phases of the clock signal. The delay lock loop is rising edge triggered, such that a rising edge of a signal on each tap corresponds to the rising edge of the input clock signal.

In one embodiment of the delay lock loop, sixteen taps are provided for each tick of the clock signal, 32 taps for the full clock period. Thus, the eighth tap provides a clock signal (CLK90) which has a rising edge that is 90 degrees output phase with the rising edge of the input clock on T0, CLK. Likewise, the sixteenth tap provides a 180 degree shifted signal from tap T0 (CLK180). The different phases of the clock signal are used to capture input data, or for generating a clock signal to strobe output latches and driving data outputs during a read operation in a memory device. Further, numerous internal clock signals are generated from the delay lock loop circuit. The phase signals are actual phase signals relative to the input clock signal period. For example, a 180° phase signal is not merely an inverted input clock signal, but is a 180° phase shifted signal based upon the input clock signal period.

Figure 3:
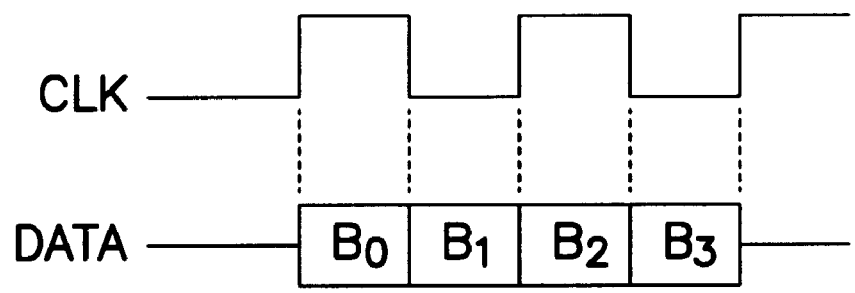
FIG. 3 illustrates data communication in correlation with a clock signal.

In some synchronous memory devices, such as SLDRAM's, it is assumed that data provided on a data bus contains the same duty cycle distortion which may be present in a corresponding clock signal. Duty cycle correction, therefore, is avoided on both the input clock and data to the memory device. As a result, duty cycle correction is not available on the clock signal input into the delay lock loop circuit. It is desired to have duty cycle correction on data output from the memory device, however, such that when data and the corresponding clock signal are output from the memory device they are restored to a 50/50 duty cycle. Referring to FIG. 3, a typical data stream provided on the data bus is illustrated wherein each bit of data is communicated in correlation with both edge transitions of the corresponding data clock signal. It will be appreciated that a 50/50 duty cycle is desired in the clock signal and data stream to maximize the availability of each bit of data in the data stream.

Figure 4:
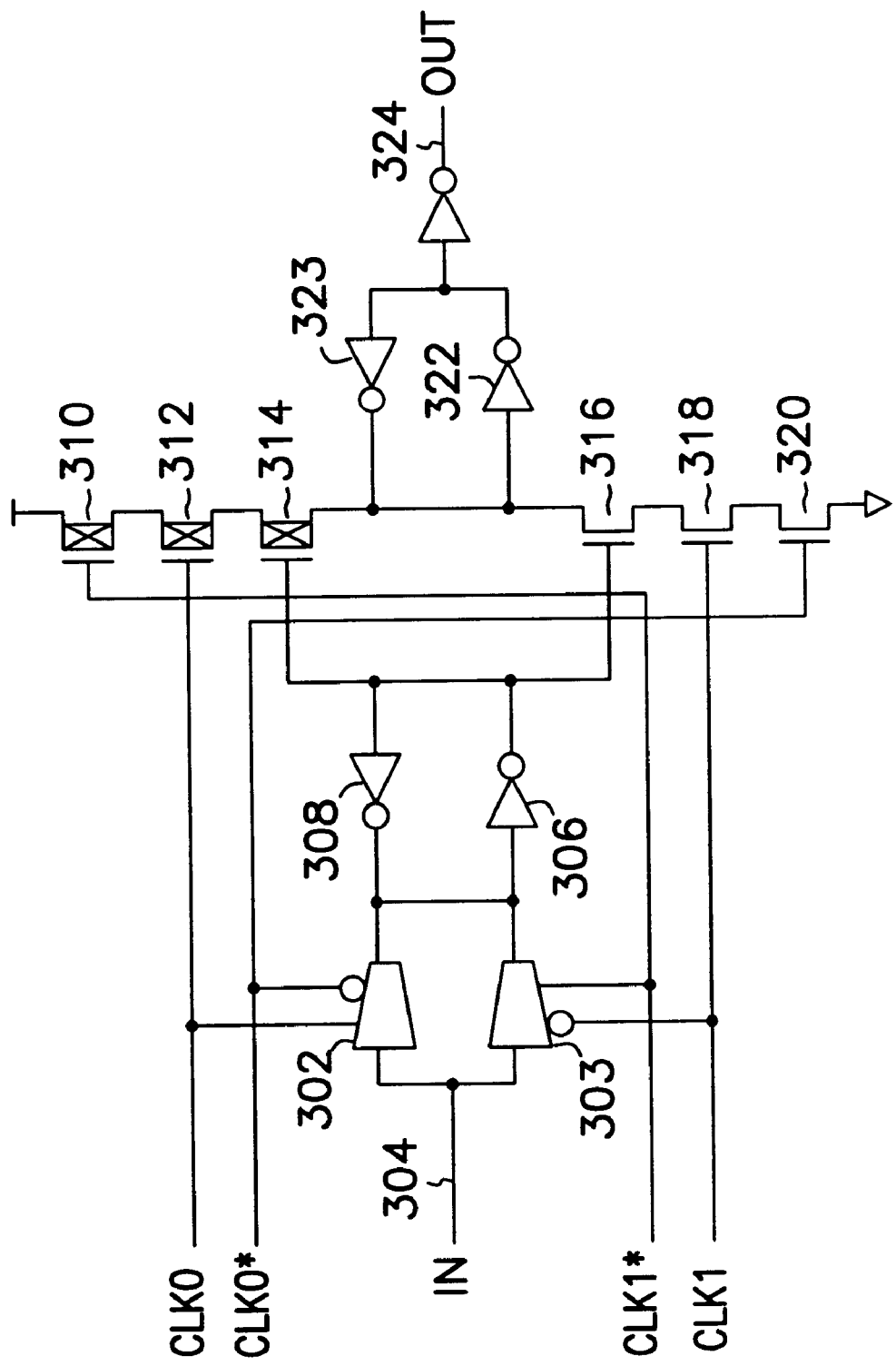
FIG. 4 is a schematic diagram of a latch register circuit.

FIG. 4 is a schematic diagram of a two-stage data driver circuit 300 which can take advantage of the present invention. The data driver circuit receives input data at node 304 and produces an output signal at node 324. The input data is alternately coupled through multiplex circuits 302 and 303 in response to CLK0 and CLK1. That is, when the CLK0 signal is high, multiplex circuit 302 is activated to couple node 304 to the input of invertor 306. Likewise, when the CLK1 signal is low, multiplex circuit 303 is activated to couple node 304 to the input of invertor 306. The series connected transistors 310–320 are selectively activated in response to invertor 306 and the CLK0 and CLK1 signals to couple the two latch circuits of the driver circuit. The first latch is defined by inverters 306 and 308, and the second latch is defined by inverters 322 and 323. It will be appreciated that inverters 308 and 323 are weak inverters used to provide feedback for the latch circuits while allowing the data which is latched to be easily updated.

Figure 5A:
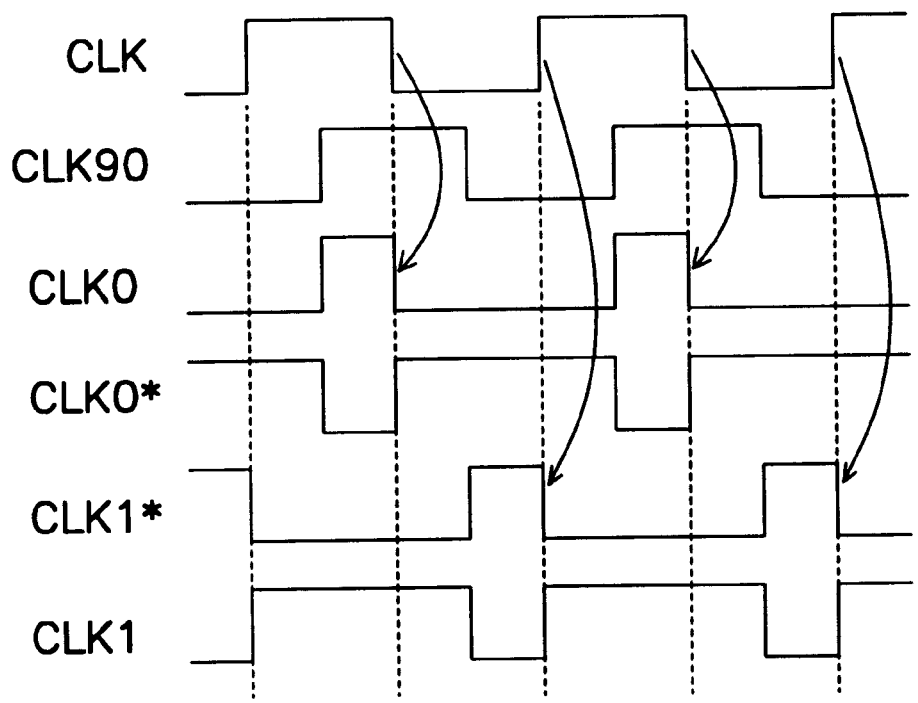
FIG. 5A is a timing diagram of the signals provided to the circuit of FIG. 4.

Referring to FIG. 5A, a timing diagram is provided to illustrate the CLK0 and CLK1 signals with respect to CLK and CLK90 (90° phase shift). The CLK0 and CLK1 signals are separated by one tick (½ period). Further, the driver circuit 300 operates as a register such that data is latched in invertors 306 and 308 in response to either one of the clock signals (CLK or CLK90), and coupled to invertors 322 and 324 in response to the activation of the series transistors. For example, when CLK0 is low and CLK1 is high, transistors 310, 312, 318 and 320 are activated. The input to invertor 322, therefore, is dependent upon the output of invertor 306. The data signal latched by invertor 306 and 308 is thus latched for output on node 324. When the CLK0 signal transitions to a high state, transistors 312 and 320 are deactivated to isolate invertor 322 from invertor 306 while new data is latched from input 304 through multiplex circuit 302. When the CLK0 signal returns to a low state, new data is latched at output 324. Because the driver circuit of FIG. 4 provides output in response to transitions in CLK0 and CLK1, accurate transitions of these signals are desired. It will be appreciated, that the falling edge of the CLK0 and CLK1* signals are critical in this latch configuration because data is transferred from invertor 306 to invertor 322 via the series transistors which are activated on these signal edges. This step of transferring data is referred to herein as closing the data driver circuit.

Figure 5B:
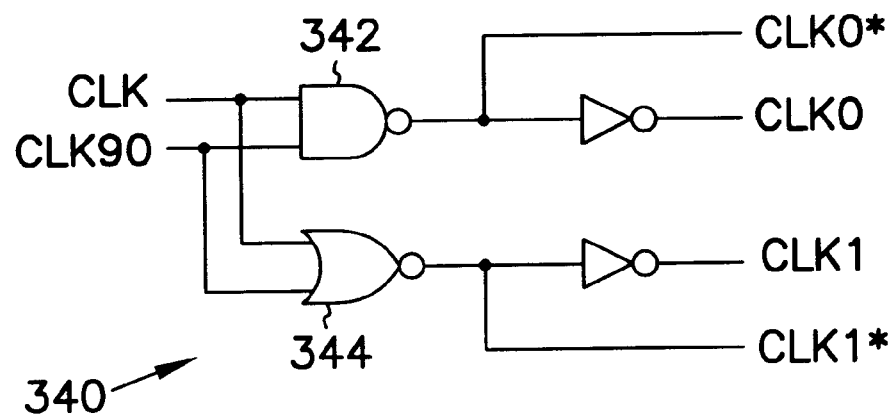
FIG. 5B is a schematic diagram of a NAND/NOR circuit which can produce signals of FIG. 5A.

FIG. 5B illustrates a simple NAND/NOR gate circuit 340 which could be used to generate the CLK0 and CLK1 signals. The circuit includes NAND gate 342 and NOR gate 344 which receive input signals CLK and CLK90. A problem with the NAND/NOR gate circuit 340 is that it is difficult, if not impossible, to eliminate skew between the output signals because of non-symmetrical signal propagation paths through the NAND and NOR gates. As appreciated by those skilled in the art, it is undesirable to have skew between signals CLK0 and CLK1. To reduce this problem, latch pulse circuits are described herein which reduced skew between the clock signals. Further, one embodiment of the invention allows for correction of duty cycle distortion. The clock signal generator circuits described below are configured to have symmetrical propagation paths from two input clock signals to two output clock signals. A memory device, or system, can include either, or both, clock signal generator circuits to reduce signal skew and duty cycle correction.

Data Latch/Driver Timing Circuitry

Figure 6:
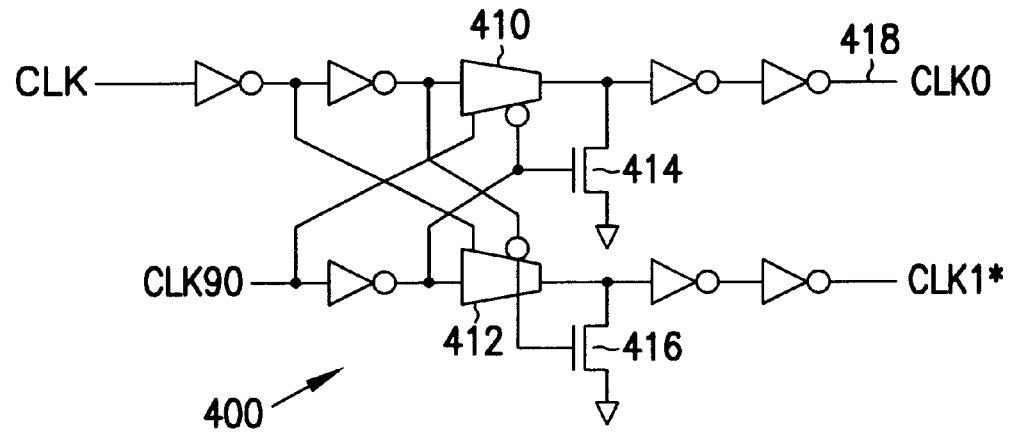
FIG. 6 is a schematic diagram of a circuit according to the present invention which provides data latch driver signals with minimal skew.
Figure 7:
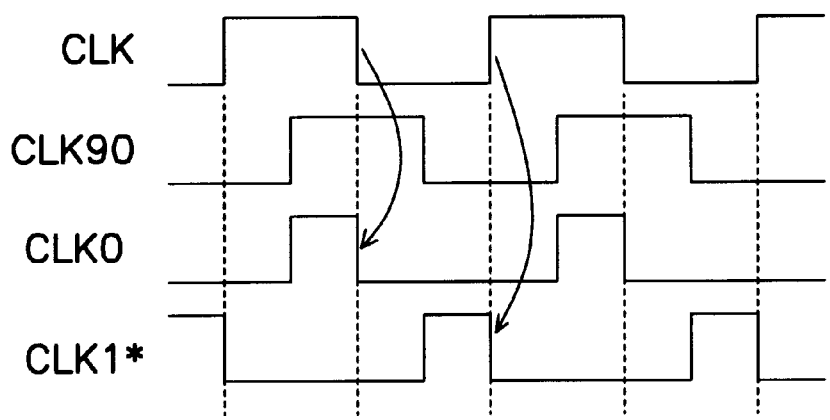
FIG. 7 is a timing diagram of the operation of this circuit of FIG. 6.

One embodiment of a latch pulse circuit 400 which generates latch/driver clock pulses is illustrated in FIG. 6. This circuit uses input signals CLK and CLK90 similar to the circuit of FIG. 5B. Latch pulse circuit 400 is best understood with reference to the timing diagram of FIG. 7. Looking first at signal CLK0, the output at node 418 will be low anytime transistor 414 is activated. Thus, CLK0 will be low when CLK90 is low. When CLK90 transitions to a high state, transistor 414 is deactivated and multiplex circuit 410 is activated. Because the CLK is high when the CLK90 signal transitions high, output signal CLK0 transitions to a high state. CLK0 will remain high until the CLK signal transitions to a low state. Similarly, CLK1* will be at a low state while transistor 416 is activated in response to a high state of CLK. When transistor 416 is deactivated, multiplex circuit 412 is activated. Output signal CLK1* remains low until input signal CLK90 transitions to a low state and is coupled through multiplex circuit 412. CLK1* maintains the high state until the CLK signal transitions to a high state. The falling edge of both CLK0 and CLK1* are therefore driven by the CLK signal. The data driver circuit 300 operation is improved using circuit 400, as described above, because the data driver circuit is closed in response to the falling edge of these signals. As long as the CLK signal remains at a 50% duty cycle, the CLK0 and CLK1* signals will remain one tick apart. The latch pulse circuit is configured so that the propagation paths for the CLK and CLK90 signals are symmetrical.

Figure 8:
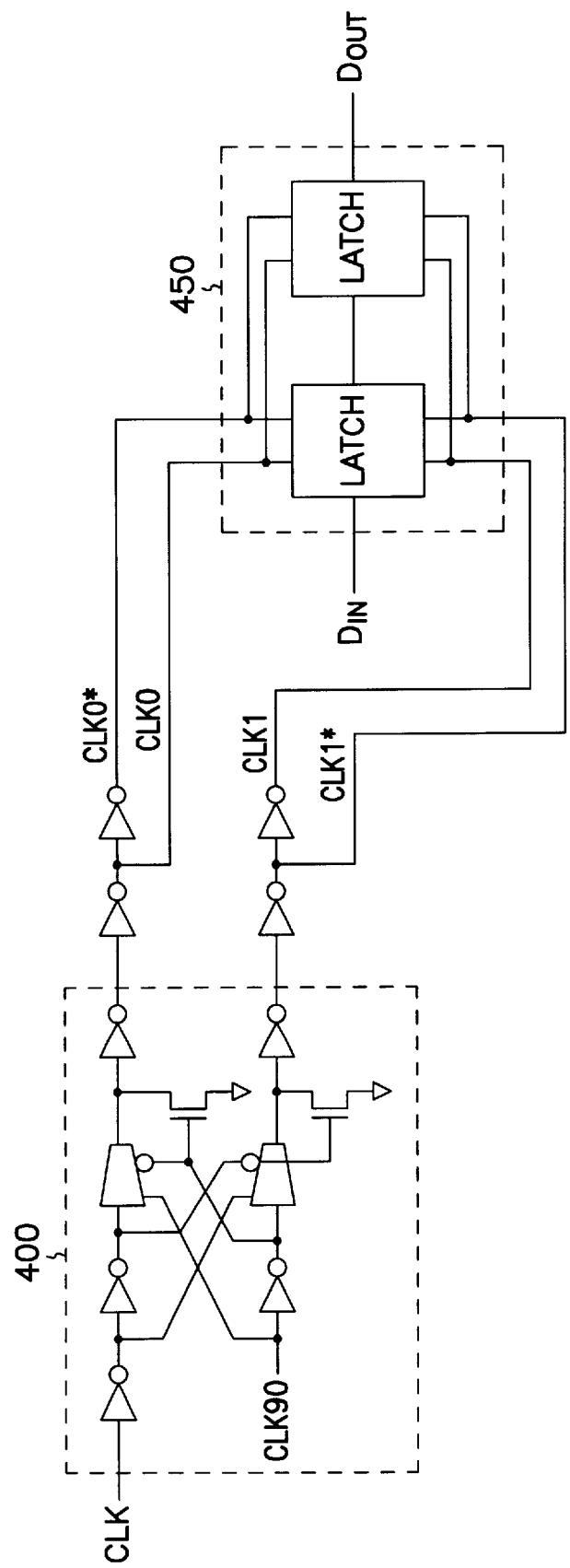
FIG. 8 is a schematic diagram of a write data latch circuit of the present invention.

FIG. 8 illustrates a write data latch circuit according to the present invention. The write data latch circuit includes control signal generation circuit 400 which is similar to the circuit described in FIG. 6, but includes additional output coupled invertor circuits. Output signals from the generation circuit are coupled to a two stage latch circuit 450. As described with reference to FIG. 4, the two stage latch circuit outputs data in response to both the rising and falling edges of the data bus clock signal has provided through signals CLK0 and CLK1.

Figure 9:
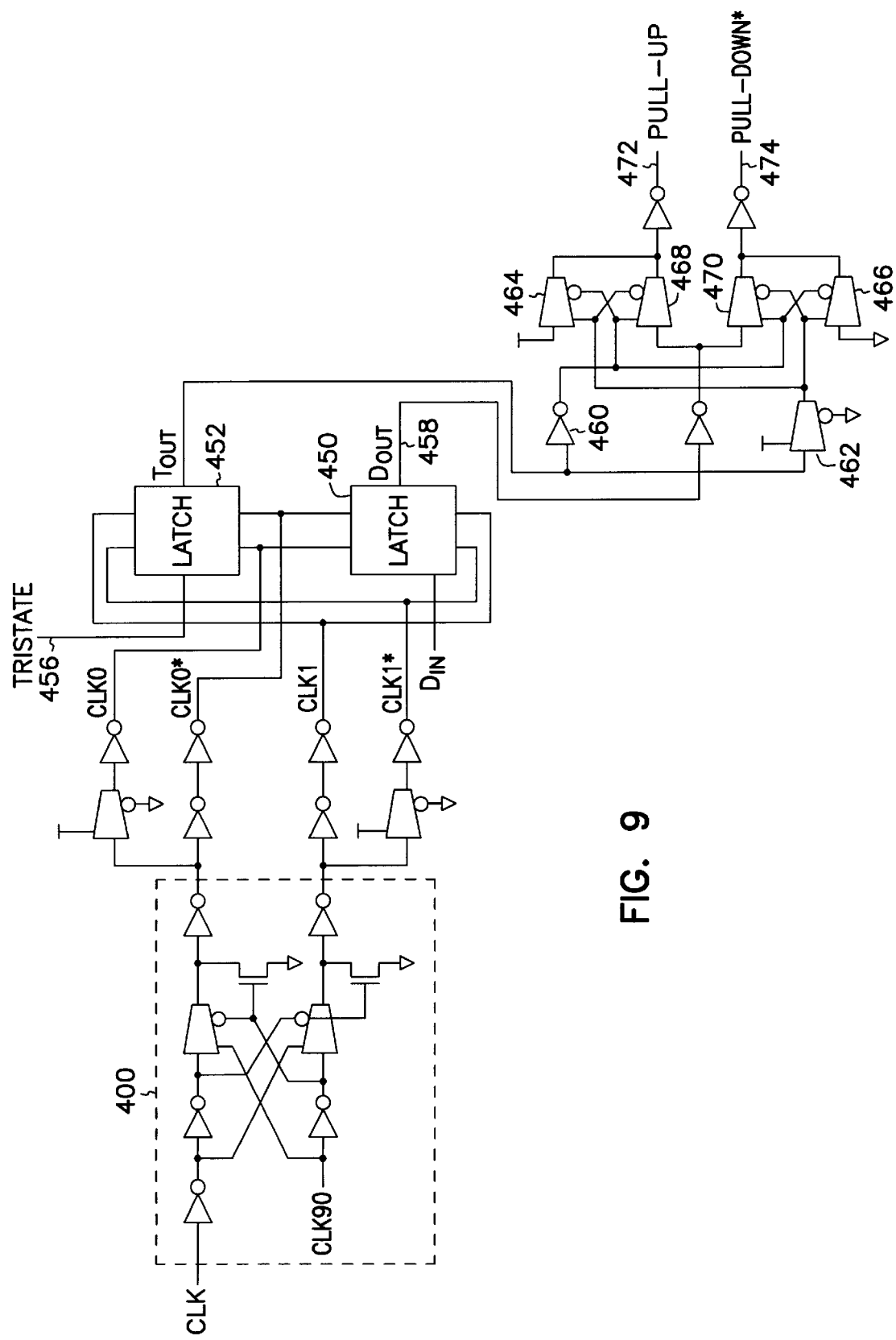
FIG. 9 is a schematic diagram of a data output latch of the present invention.

FIG. 9 illustrates a data output latch according to the present invention. The circuit includes clock pulse generator circuit 400, a first two stage latch circuit 450, and a second two stage latch circuit 452. The first latch circuit 450 provides data output on node 458, while the second latch circuit is used to place an output node in a tri-state condition. During data output operations, latch circuit 450 operates as described above to couple data to node 458 in response to the CLK0 and CLK1* signals. The data signal from node 458 is coupled through multiplex circuits 468 and 470 to provide either a pull-up signal 472, or a pull-down signal 474. During active output operations the output from latch circuit 452 is low such that multiplex circuits 468 and 470 are active. During an inactive output state, a high signal is provided through tri-state input line 456 and coupled to the input of invertor 460 and multiplex circuit 462. As a result, multiplex circuits 468 and 470 are deactivated, and multiplex circuits 464 and 466 are activated to provide both active pull-up and pull-down signals. It will be appreciated by those skilled in the art that a push-pull type output bus driver circuit is provided for output data communication lines which operate in response to the pull-up and pull-down signals.

Figure 10:
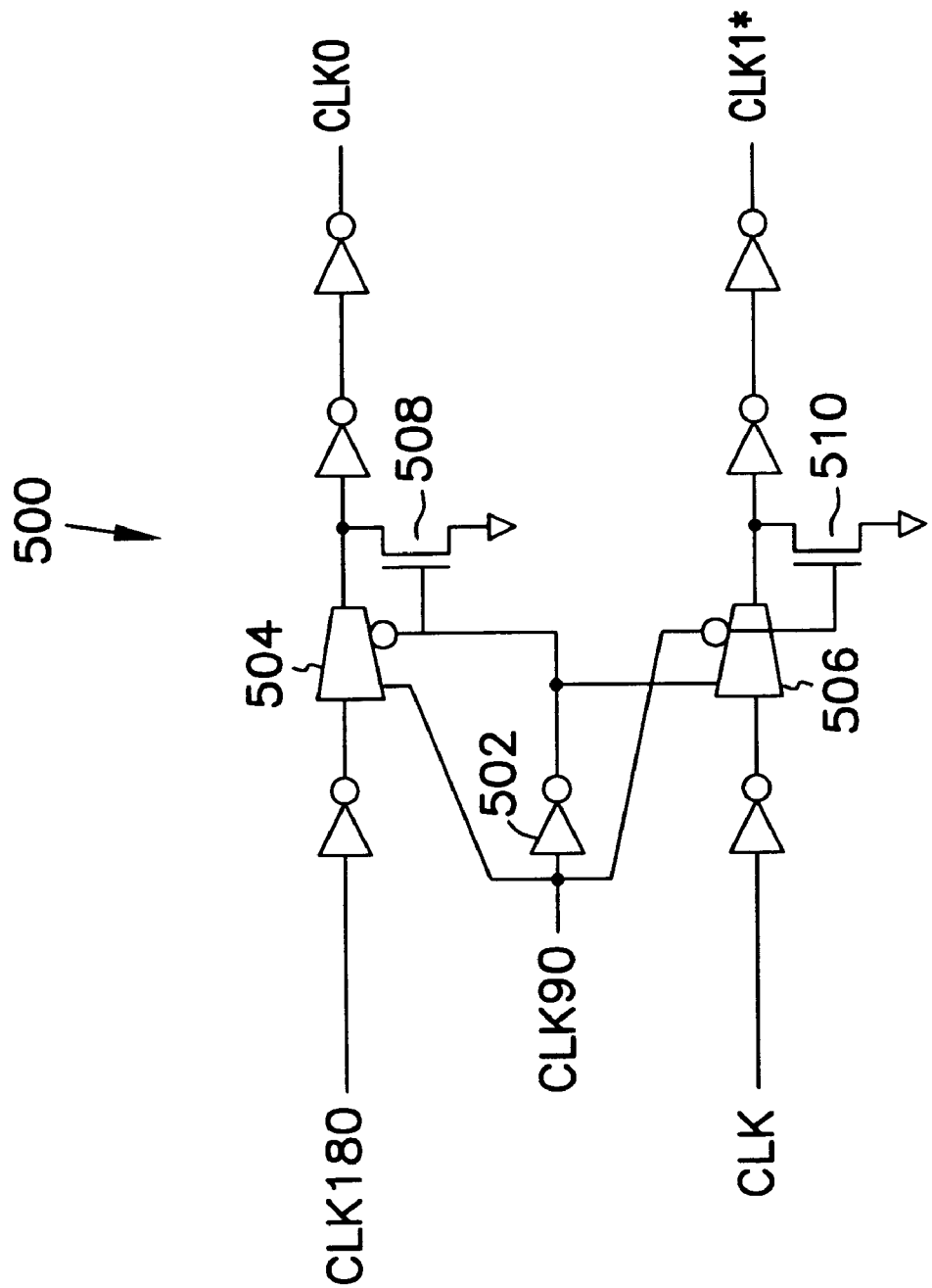
FIG. 10 is a schematic diagram of an alternate embodiment of the present invention which provides latch signals with minimal skew and duty cycle distortion correction.

If the CLK signal has duty cycle distortion, the distortion can be corrected by using three clock phases rather than only two. The signals used are spaced at 0, 90 and 180 degrees, and are obtained from output taps from the DLL delay line of FIG. 2. One embodiment of a circuit 500 which generates latch clock pulses that have a duty cycle correction is illustrated in FIG. 10 and explained with reference to the timing diagrams of FIGS. 11 and 12. The pulse generator circuit includes invertor 502 which is coupled to enable inputs to multiplex circuits 504 and 506. Invertor 502 is also coupled to gates of transistors 508 and 510.

Figure 11:
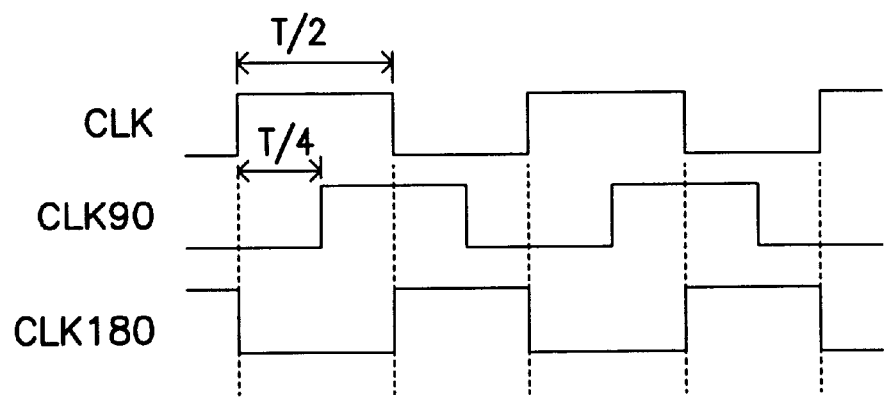
FIG. 11 is an ideal timing diagram with no duty cycle distortion.
Figure 12:
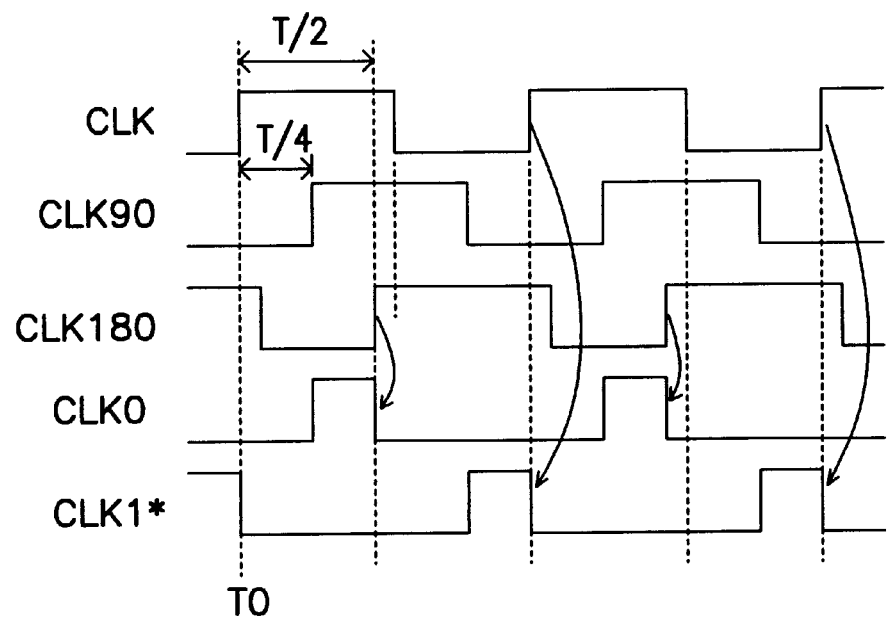
FIG. 12 is a timing diagram illustrating a clock signal with duty cycle distortion and output signals from the circuit of FIG. 10.

The pulse generator circuit 500 of FIG. 10 uses three clock signals with relative phases of 0°, 90° and 180° to generate the latch/driver control signals. In an ideal timing diagram, as illustrated in FIG. 11, the clock signal has a 50/50 duty cycle such that both the high state and low state of the signal is one-half of the clock period. However, data communication provided on the data bus often deviates from the ideal clock signal. That is, the clock signal can have a distorted duty cycle, as illustrated in FIG. 12. To understand the operation of the circuit of FIG. 10, the distorted signal of FIG. 12 is used.

Initially at time T0 when the CLK90 signal is low, multiplex circuit 504 is deactivated and the CLK0 signal is pulled low via activated transistor 508. Once the CLK90 signal transitions to a high state, the inverse of the signal provided on CLK180 is coupled to the CLK0 signal output. The CLK0 signal remains low until the CLK90 signal goes high, at which time CLK0 transitions to a high state in response to the low state of CLK180. When the CLK180 signal transitions to a high state, the CLK0 returns to a low state until the next high transition in CLK90.

The CLK1* signal is generated in a similar manner to the CLK0 signal. That is, multiplex circuit 506 is deactivated when the CLK90 signal is high. During this state, transistor 510 is active to pull the CLK1* signal low. When the CLK90 signal transitions to a low state, the CLK1* signal follows the inverse of the CLK signal. Referring to FIG. 12, therefore, CLK1* is low when CLK is high and remains in the low state when the CLK90 signal goes high. When the CLK90 signal transitions low, the CLK1* transitions to a high state in response to CLK. When the CLK signal transitions to a high state, the CLK1* signal returns to in low state.

The pulse generator circuit 500, therefore, produces output signals CLK0 and CLK1* which have corresponding high-to-low signal transitions that are spaced one tick apart even though the input clock signal has a distorted duty cycle. The duty cycle correction is accomplished by using a combination of the input clock signal, a 90 degree phase shifted signal, and a 180 phase shifted signal. Again, the 90 degree and 180 degrees signals are generated in response to a period of the input clock signal, and not dependant upon the duty cycle of the input clock signal. The signals used are spaced at 0°, 90° and 180°, but can be 90°, 180° and 270° or any other combination which is available. Further, both embodiments of the pulse generator circuit 400 and 500 provide a minimal amount of skew between corresponding signal transitions of output signals by providing symmetric propagation paths which are controlled in response to either an input clock signal or a 90 degree phase shifted signal. Although falling edge transitions have been described herein, it will be appreciated that the pulse generator circuits can be configured to provide accurately placed rising edges, if desired, without departing from the present invention.

Conclusion

A synchronous memory device and system have been described which communicates bi-directional data via a bus and data clock. Although it is preferred that the data clock have a 50/50 duty cycle, it is accepted that duty cycle error may be present on the bus. To capture data from the bus, a latch circuit is described which operates in response to internally generated clock signals. A pulse generator circuit has been described which produces these internal clock signals, and insures accurate latching of data without wasting valuable timing by minimizing signal skew. The pulse generator circuit has been described as having at least two propagation paths that are symmetrical and operate from clock signals 90 degrees out of phase. The memory has also been described as having a pulse generator circuit which minimizes skew and also corrects duty cycle error present on the data clock. This circuit uses three clock signals which have relative phases of 0, 90 and 180 degrees. Again, propagation paths through the pulse generator circuit are symmetrical to minimize skew between the outputs.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A synchronous memory pulse generator comprising:
   a clock signal generator circuit coupled to receive an input clock signal and provide a plurality of phase shifted output signals including a first clock signal and a second clock signal that is 90 degrees out-of-phase with the first clock signal; and
   a pulse generator circuit coupled to the clock signal generator circuit for providing first and second output signals having corresponding transitions with minimal skew, the pulse generator circuit comprising:
      a first pass gate coupled to receive the first clock signal and provide the first output signal on a first output node which is coupled to a drain of a first transistor, the first pass gate being controlled by the second clock signal;
      a second pass gate coupled to receive the second clock signal and provide the second output signal on a second output node which is coupled to a drain of a second transistor, the second pass gate being controlled by the first clock signal.

2. The synchronous memory pulse generator of claim 1 wherein the first and second transistors are first and second N-channel pulldown transistors respectively coupled to the first and second output nodes, the first transistor having a gate coupled to receive an inverse of the second clock signal, and the second transistor having a gate coupled to receive the first clock signal.

3. The synchronous memory pulse generator of claim 1 wherein the first and second output signals are coupled to a data latch circuit.

4. The synchronous memory pulse generator of claim 3 wherein the data latch circuit comprises a two stage latch including a first latch having an output which is electrically coupled to an input of a second latch on falling edges of the first and second output signals.

5. The synchronous memory pulse generator of claim 1 wherein the first and second output signals are coupled to a tri-state latch circuit for placing an output data connection in a tri-state condition.

6. The synchronous memory pulse generator of claim 1 wherein the synchronous memory device is an SLDRAM.

7. The synchronous memory pulse generator of claim 1 wherein the second clock signal is generated by delaying the first clock signal by ¼ of a period of the first clock signal (T/4).

8. A synchronous memory pulse generator comprising:
   a clock signal generator circuit coupled to receive a first clock signal and provide a plurality of phase shifted output signals including a second clock signal that is 90 degrees out-of-phase with the first clock signal and a third clock signal that is 180 degrees out-of-phase with the first clock signal; and a pulse generator circuit coupled to the clock signal generator circuit for providing first and second output signals having corresponding transitions spaced apart by one-half of a period of the first clock signal, the pulse generator circuit comprising:
- a first pass gate coupled to receive the first clock signal and provide the first output signal on a first output node which is coupled to a drain of a first pulldown transistor, the first pass gate being controlled by the second clock signal;
- a second pass gate coupled to receive the third clock signal and provide the second output signal on a second output node which is coupled to a drain of a second pulldown transistor, the second pass gate being controlled by the second clock signal.

9. The synchronous memory pulse generator of claim 8 wherein the second clock signal is generated by delaying the first clock signal by ¼ of a period of the first clock signal (T/4).

10. The synchronous memory pulse generator of claim 8 wherein the third clock signal is generated by delaying the first clock signal by ½ of a period of the first clock signal (T/2).

11. The synchronous memory pulse generator of claim 8 wherein the first and second pulldown transistors comprise N-channel transistors, the first transistor having a gate coupled to receive the second clock signal, and the second transistor having a gate coupled to receive an inverse of the second clock signal.

12. The synchronous memory pulse generator of claim 8 wherein the synchronous memory device is an SLDRAM.

13. A synchronous memory device pulse generator circuit with minimal output signal skew comprising:
- a first signal propagation path defined by a first inverter coupled to receive an inverted first clock signal, an output of the first inverter is coupled to an input of a first pass gate, an output of the first pass gate being coupled to an input of a second inverter and a drain of a first pulldown transistor; and
- a second signal propagation path defined by a third inverter coupled to receive a second clock signal which is 90 degrees out of phase with the first clock signal, an output of the third inverter being coupled to an input of a second pass gate, an output of the second pass gate being coupled to an input of a fourth inverter and a drain of a second pulldown transistor;

wherein the first pass gate is enabled by the second clock signal and the first pulldown transistor is activated by an inverted second clock signal, the second pass gate is enabled by the inverted first clock signal and the second pulldown transistor is activated by the first clock signal.

14. The synchronous memory device pulse generator circuit of claim 13 wherein the outputs of the second and fourth inverters are coupled to a data latch circuit.

15. A synchronous memory device pulse generator circuit with minimal output signal skew and duty cycle correction comprising:
- a first signal propagation path defined by a first inverter coupled to receive a first clock signal, an output of the first inverter is coupled to an input of a first pass gate, an output of the first pass gate being coupled to a drain of a first pulldown transistor; and
- a second signal propagation path defined by a second inverter coupled to receive a second clock signal which is 180 degrees out of phase with the first clock signal, an output of the second inverter being coupled to an input of a second pass gate, an output of the second pass gate being coupled to a drain of a second pulldown transistor;

wherein the first pass gate is enabled by an inverse of a third clock signal which is 90 degrees out of phase with the first clock signal and the first pulldown transistor is activated by the third clock signal, the second pass gate is enabled by the third clock signal and the second pulldown transistor is activated by the inverse third clock signal.

16. The synchronous memory device pulse generator circuit of claim 15 wherein the outputs of the first and second pass gates are coupled to an output data driver circuit.

* * * * *

UNITED STATES PATENT AND TRADEMARK OFFICE
CERTIFICATE OF CORRECTION

PATENT NO. : 6,111,446  
DATED : August 29, 2000  
INVENTOR(S) : Brent Keeth

Page 1 of 1

It is certified that error appears in the above-identified patent and that said Letters Patent is hereby corrected as shown below:

Under U.S. PATENT DOCUMENTS, please add
```
-- 4,527,075    7/1985    Zbinden............327/175 --
 --5,128,563    7/1992    Hush et al. ........326/87 --
-- 5,128,560    7/1992    Chern et al. .......327/530 --
-- 5,165,046   11/1992    Hesson.............327/111 --
-- 5,274,276   12/1993    Casper et al. ......326/21 --
-- 5,329,186    7/1994    Hush et al. .........326/88 --
-- 5,347,179    9/1994    Casper et al. .......326/122 --
-- 5,349,247    9/1994    Hush et al. .........326/88 --
-- 5,614,855    3/1997    Lee et al. ...........327/158 --
-- 5,627,487    5/1997    Keeth...............327/112 --
```

Signed and Sealed this

Eighteenth Day of December, 2001

*Attest:*

*Attesting Officer*

JAMES E. ROGAN  
*Director of the United States Patent and Trademark Office*